United States Patent
Chen et al.

(10) Patent No.: US 9,859,900 B2
(45) Date of Patent: Jan. 2, 2018

(54) JITTER CONTROL CIRCUIT WITHIN CHIP AND ASSOCIATED JITTER CONTROL METHOD

(71) Applicant: MEDIATEK INC., Hsin-Chu (TW)

(72) Inventors: Shang-Pin Chen, Hsinchu County (TW); Sheng-Feng Lee, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/091,588

(22) Filed: Apr. 6, 2016

(65) Prior Publication Data
US 2016/0359488 A1 Dec. 8, 2016

Related U.S. Application Data

(60) Provisional application No. 62/171,584, filed on Jun. 5, 2015.

(51) Int. Cl.
*H03L 1/00* (2006.01)
*G01R 31/317* (2006.01)
*H03L 7/00* (2006.01)
*H04L 7/00* (2006.01)
*H04L 7/06* (2006.01)

(52) U.S. Cl.
CPC .......... *H03L 1/00* (2013.01); *G01R 31/31709* (2013.01); *H03L 7/00* (2013.01); *H04L 7/0087* (2013.01); *H04L 7/065* (2013.01)

(58) Field of Classification Search
CPC . H03L 1/00; H03L 7/00; H04L 7/0087; H04L 7/065; H02M 1/00; G01R 31/31709
USPC .......................................... 327/156, 158, 161
See application file for complete search history.

(56) References Cited

U.S. PATENT DOCUMENTS

| | | | |
|---|---|---|---|
| 8,836,384 B1 * | 9/2014 | Oh | H03K 19/00346 327/109 |
| 2006/0022744 A1 | 2/2006 | Wu | |
| 2007/0250281 A1 * | 10/2007 | Ishida | G01R 31/31709 702/89 |
| 2008/0074200 A1 | 3/2008 | Cong | |
| 2014/0301118 A1 | 10/2014 | Yabuzaki | |

* cited by examiner

*Primary Examiner* — John Poos
(74) *Attorney, Agent, or Firm* — Wolf, Greenfield & Sacks, P.C.

(57) ABSTRACT

A jitter control circuit within a chip comprises an adaptive PDN, a current generator and a jitter generator. The adaptive PDN is capable of being controlled/modulated to provide difference impedances. The current generator is coupled to the adaptive PDN, and is arranged for receiving a supply voltage provided by the adaptive PDN and generating currents with different patterns. The jitter generator is coupled to the adaptive PDN, and is arranged for generating a plurality of jitters corresponding to the currents with different patterns, respectively, according to the supply voltage provided by the adaptive PDN.

18 Claims, 4 Drawing Sheets

US 9,859,900 B2

JITTER CONTROL CIRCUIT WITHIN CHIP AND ASSOCIATED JITTER CONTROL METHOD

CROSS REFERENCE TO RELATED APPLICATIONS

This application claims the priority of U.S. Provisional Application No. 62/171,584, filed on Jun. 5, 2015, which is included herein by reference in its entirety.

BACKGROUND

For a chip supplied by an external supply voltage, the external supply voltage is inputted into the chip via a power delivery network (PDN) including many connections such as printed circuit board (PCB) routing, substrate traces, wire bond, input/output pad and internal metal layer etc. The PDN can be modeled as a RLC circuit consisting of a resistor, an inductor and a capacitor, and impedance of the PDN varies with a frequency thereon. In addition, because the chip also includes a plurality of drivers that may sink currents from the PDN, the current generated by the drivers and the impedance of the PDN form a supply voltage noise on the PDN. This supply voltage noise may cause a clock generator within the chip to generate a clock with serious jitter. Therefore, providing a scheme to reduce this power supply induced jitter (PSIJ) is an important topic.

SUMMARY

It is therefore an objective of the present invention to provide a Jitter control circuit and associated jitter control method to effectively reduce the power supply induced jitter, to solve the above-mentioned problem.

According to one embodiment of the present invention, a jitter control circuit within a chip comprises an adaptive PDN, a current generator and a jitter generator. The adaptive PDN is capable of being controlled/modulated to provide difference impedances. The current generator is coupled to the adaptive PDN, and is arranged for receiving a supply voltage provided by the adaptive PDN and generating currents with different patterns. The jitter generator is coupled to the adaptive PDN, and is arranged for generating a plurality of jitters corresponding to the currents with different patterns, respectively, according to the supply voltage provided by the adaptive PDN.

According to another embodiment of the present invention, a jitter control method comprises: providing an adaptive PDN capable of being controlled/modulated to provide difference impedances; receiving a supply voltage provided by the adaptive PDN and generating currents with different patterns; and generating a plurality of jitters corresponding to the currents with different patterns, respectively, according to the supply voltage provided by the adaptive PDN.

According to another embodiment of the present invention, a jitter control circuit within a chip comprises an adaptive PDN, a current generator and a controller. The adaptive PDN is capable of being controlled/modulated to provide difference impedances. The current generator is coupled to the adaptive PDN, and is arranged for receiving a supply voltage provided by the adaptive PDN and generating a current. The controller is coupled to the adaptive PDN and the current generator, and is arranged for controlling the impedance of the adaptive PDN according to a pattern of the current generated by the current generator.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
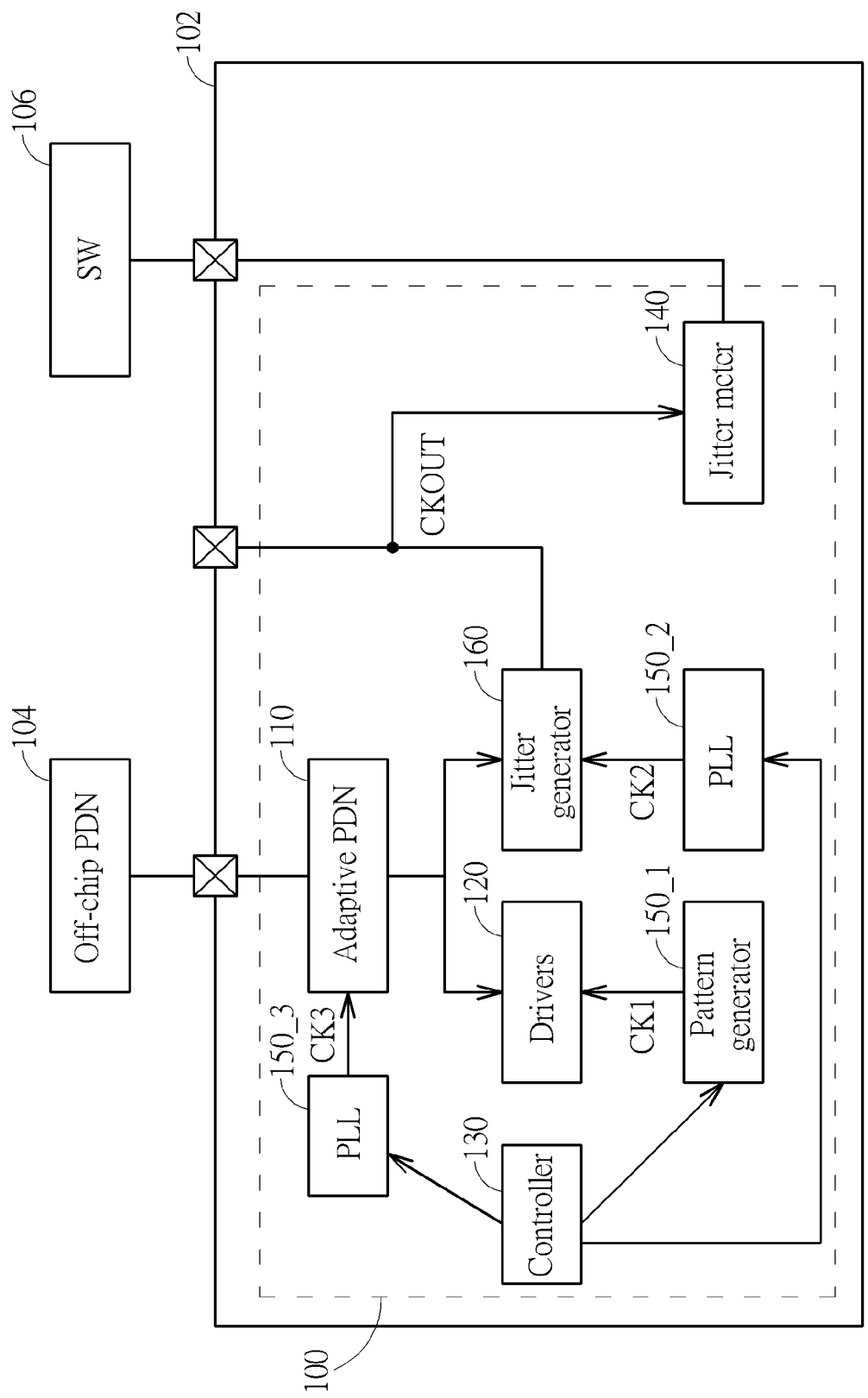
FIG. 1 is a diagram illustrating a jitter control circuit according to one embodiment of the present invention.

Please refer to FIG. 1, which is a diagram illustrating a jitter control circuit 100 according to one embodiment of the present invention. As shown in FIG. 1, the jitter control circuit 100 is within a chip 102, and the jitter control circuit 100 comprises an adaptive power delivery network (PDN) 110, a current generator (in this embodiment, the current generator is implemented by a plurality of drivers 120), a controller 130, a jitter meter 140, a pattern generator 150_1 (in this embodiment, the pattern generator 150_1 may be implemented by a phase-locked loop (PLL)), two PLL 150_2 and 150_3 and a jitter generator 160. In addition, the adaptive PDN 110 is coupled to an off-chip PDN 104, and the jitter meter 140 is coupled to a software side 106.

In this embodiment, the off-chip PDN 104 is coupled to an external power supply, and is arranged to provide a supply voltage to the adaptive PDN 110 of the chip 102, and the adaptive PDN 110 provides the received supply voltage to the drivers 120 and the jitter generator 160 and other elements required using the supply voltage. The drivers 120 can be any functional circuit elements that may provide or sink current according to the supply voltage. The jitter generator 160 is arranged to output an output clock CKOUT based on a clock CK2 provided by the PLL 150_2 and the supply voltage. The pattern generator 150_1 is arranged to provide a clock CK1 to the drivers 120 to control the pattern of the current (hereinafter, the frequency serves as an example of the pattern) generated by the drivers 120; and the PLL 150_3 is arranged to generate a clock CK3 to control the frequency of the adaptive PDN 110 to determine the impedance of the adaptive PDN 110.

Figure 2:
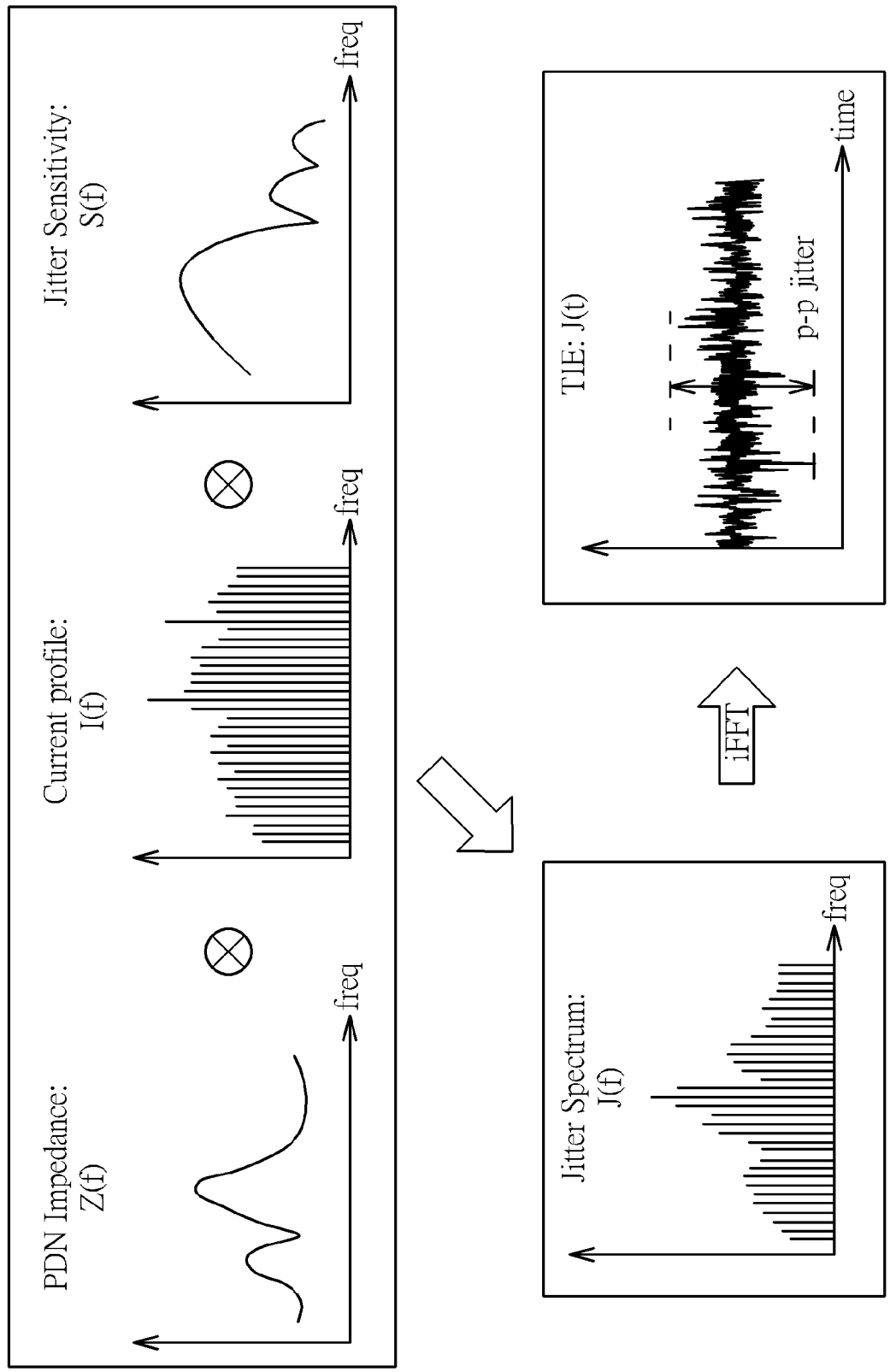
FIG. 2 shows a diagram illustrating a generation of the jitter.

In FIG. 1, a jitter level of the output clock CKOUT is determined based on the impedance of the off-chip PDN 104, the adaptive PDN 110, the frequency of the current of the drivers 120 and the sensitivity of the clock CK2. In detail, refer to FIG. 2, the jitter J(f) of the output clock CKOUT can be obtained by the product of the impedance of the off-chip PDN 104 and the adaptive PDN 110 (Z(f)), the current I(f) of the drivers 120 and the sensitivity S(f) of the clock CK2, and FIG. 2 shows a diagram of the peak-to-peak jitter (p-p jitter) when the jitter J(f) is transformed to time domain by using iFFT (inverse fast Fourier transform).

The jitter control circuit 100 may provide different operations during an off-line period and an on-line period. During an off-line period (e.g. in the production line), the jitter control circuit 100 is arranged to control frequencies of the pattern generator 150_1 and the PLL 150_3 to find some particular combinations of the frequencies of the pattern generator 150_1 and the PLL 150_3, where the particular combinations may correspond to serious jitter of an output clock CKOUT outputted by the jitter generator 160, the slight jitter of an output clock CKOUT outputted by the jitter generator 160, and/or any other required jitter information. Then, the particular combinations of the frequencies of the pattern generator 150_1 and the PLL 150_3 can be built into a look-up table, and the look-up table is stored in the chip 102 for further use. When the chip 102 is used in the on-line period, the controller 130 may refer to the look-up table to adjust the impedance of the adaptive PDN 110 according to the frequency of the current generated by the drivers 120 and/or other drivers, so as to lower the jitter of the output clock CKOUT outputted by the jitter generator 160 or to lower the jitter of the other clock(s). Detailed descriptions of the operations of the jitter control circuit 100 are provided below.

During the off-line period, first, the controller 130 controls the PLL 150_2 to output the clock CK2 with a fixed frequency, then the controller 130 controls the pattern generator 150_1 to output the clock CK1 with different frequencies to the drivers 120 to make the current have different frequencies respectively, and the controller 130 controls the PLL 150_3 to output the clock CK3 for modulating the adaptive PDN 110 to have different frequencies to have different values of impedance respectively. For every combination of the frequencies of the clocks CK1 and CK3 (i.e. the every combination of the frequencies of the adaptive PDN 110 and the current), a corresponding supply voltage noise is generated on the metal routing within the chip 102, causing different jitter level of the output clock CKOUT. Then, the jitter meter 140 determines the jitter level of the output clock CKOUT corresponding to every combination of the frequencies of the clocks CK1 and CK3 to generate a plurality of determining results, and sends the determining results to the software side 106.

In one embodiment, initially, the controller 130 may control the PLL 150_3 to output the clock CK3 to modulate the adaptive PDN 110 to have a specific frequency to have a specific impedance, then the controller 130 controls the pattern generator 150_1 to output the clock CK1 with different frequencies to the drivers 120 to make the current to have different frequencies, respectively, and the jitter meter 140 determines the jitter levels of the output clock CKOUT corresponding to the different frequencies of clock CK1 (i.e. different frequencies of the current) respectively. Then, for a portion of the frequencies of the clock CK1 whose corresponding jitters are greater than a threshold (that is the serious jitter may occur when the clock CK1 has such frequencies), the controller 130 controls the PLL 150_3 to output the clock CK3 to modulate the adaptive PDN 110 to have the different impedances, respectively, and the jitter meter 140 determines the jitter levels of the output clock CKOUT corresponding to the combinations of the current with the portion of the frequencies and the different frequencies of the adaptive PDN 110, respectively.

For example, if the jitter meter 140 determines that the serious jitter occurs when the PLL 150_3 outputs the clock CK3 with the frequency 1 GHz and the pattern generator 150_1 outputs the clock CK1 with the frequencies 300 MHz and 1 GHz, the controller 130 may fix the clock CK1 with 300 MHz and control the PLL 150_3 to output the clock CK3 to have many different frequencies to find a combination of the frequencies of the clocks CK1 and CK3 corresponding to a slight jitter, for example the clock CK3 with 2 GHz; and the controller 130 may further fix the clock CK1 with 1 GHz and control the PLL 150_3 to output the clock CK3 to have many different frequencies to find a combination of the frequencies of the clocks CK1 and CK3 corresponding to a slight jitter, for example the clock CK3 with 1.5 GHz. Then, the look-up table may record that the combination (CK1, CK3)=(300 MHz, 1 GHz) and (CK1, CK3)=(1 GHz, 1 GHz) may have serious jitter, and also record that the combination (CK1, CK3)=(300 MHz, 2 GHz) and (CK1, CK3)=(1 GHz, 1.5 GHz) may have slighter jitter.

Figure 3:
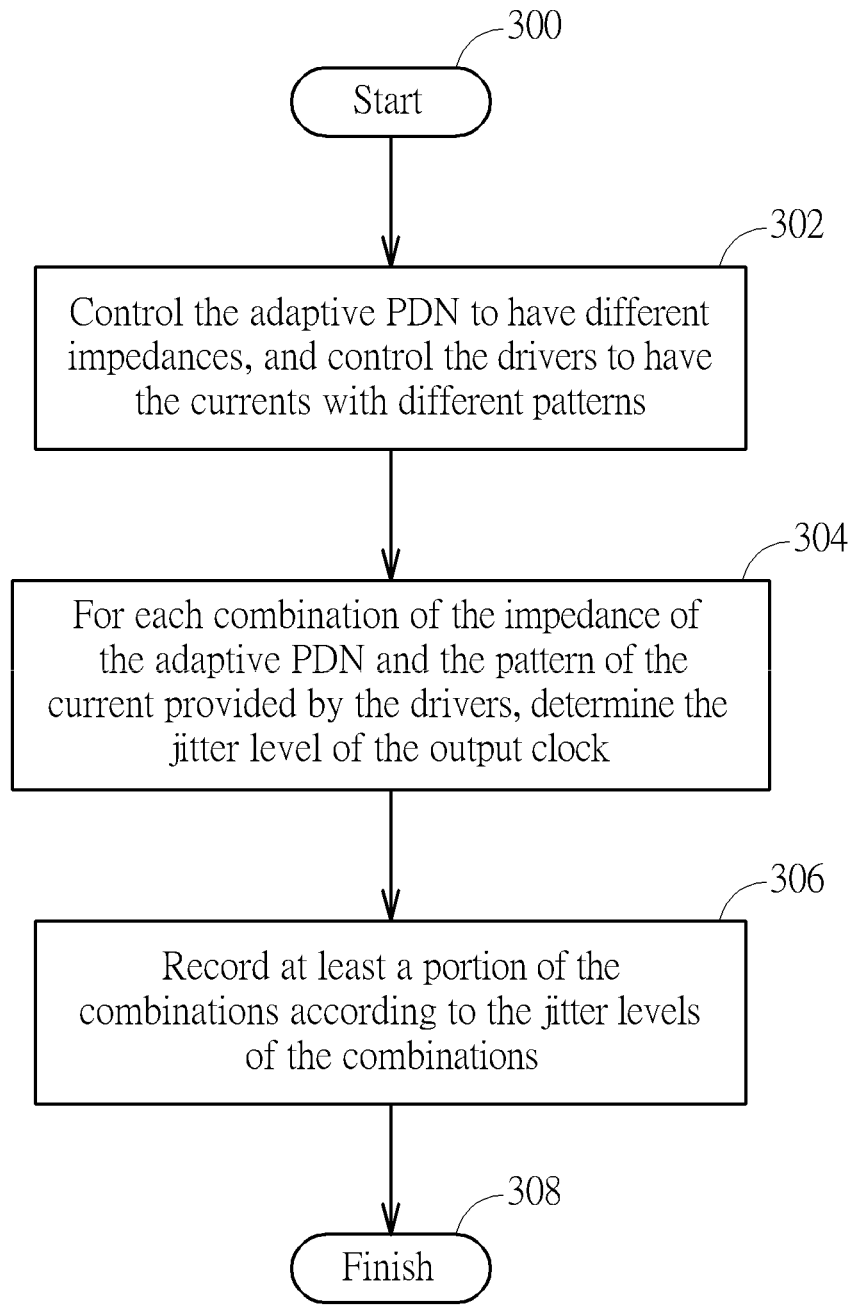
FIG. 3 is a flowchart of a jitter control method according to one embodiment of the present invention.

The operations of the jitter control circuit 100 during the off-line period are summarized as shown in FIG. 3. In FIG. 3, the flow of the jitter control method during the off-line period is as follows:

Step 300: the flow starts.

Step 302: control the adaptive PDN 110 to have different impedances, and control the drivers 120 to have the current with different frequencies.

Step 304: for each combination of the impedance of the adaptive PDN 110 and the frequency of the current provided by the drivers 120, determine the jitter level of the output clock CKOUT.

Step 306: record at least a portion of the combinations according to the jitter levels of the combinations.

Step 308: the flow finishes.

When the jitter control circuit 100 is operated during the on-line period, for example the chip 102 is built in an electronic device such as a cell phone, and the electronic device is in use, the controller 130 may refer to the look-up table to adjust the impedance of the adaptive PDN 110 according to the frequency of the current generated by the drivers 120 and/or other drivers, so as to lower the jitter of the output clock CKOUT or the other clock signals. For example, assuming that the look-up table records that the combination (CK1, CK3)=(300 MHz, 1 GHz) and (CK1, CK3)=(1 GHz, 1 GHz) may have serious jitter and records that the combination (CK1, CK3)=(300 MHz, 2 GHz) and (CK1, CK3)=(1 GHz, 1.5 GHz) may have slighter jitter, when the controller 130 detects that the current of the drivers within the chip 102 has the frequency close to or equal to 300 MHz, the controller 130 detects whether the impedance/frequency of the adaptive PDN 110 causes a clock jitter while the frequency of the current of the drivers is 300 MHz. If the controller 130 determines that the impedance/frequency of the adaptive PDN 110 causes the serious clock jitter (e.g. the frequency of the adaptive PDN 110 is 1 GHz), the controller 130 will search for an appropriate frequency of the adaptive PDN 110 in the look-up table to lower the clock jitter, for example, 2 GHz, and controls the PLL 150_3 to output the clock CK3 with the frequency 2 GHz. In addition, if the controller 130 determines that the impedance/frequency of the adaptive PDN 110 does not cause the serious clock jitter (e.g. the frequency of the adaptive PDN 110 is close to 2 GHz), the adaptive PDN 110 will not adjust the frequency of the clock CK3.

Figure 4:
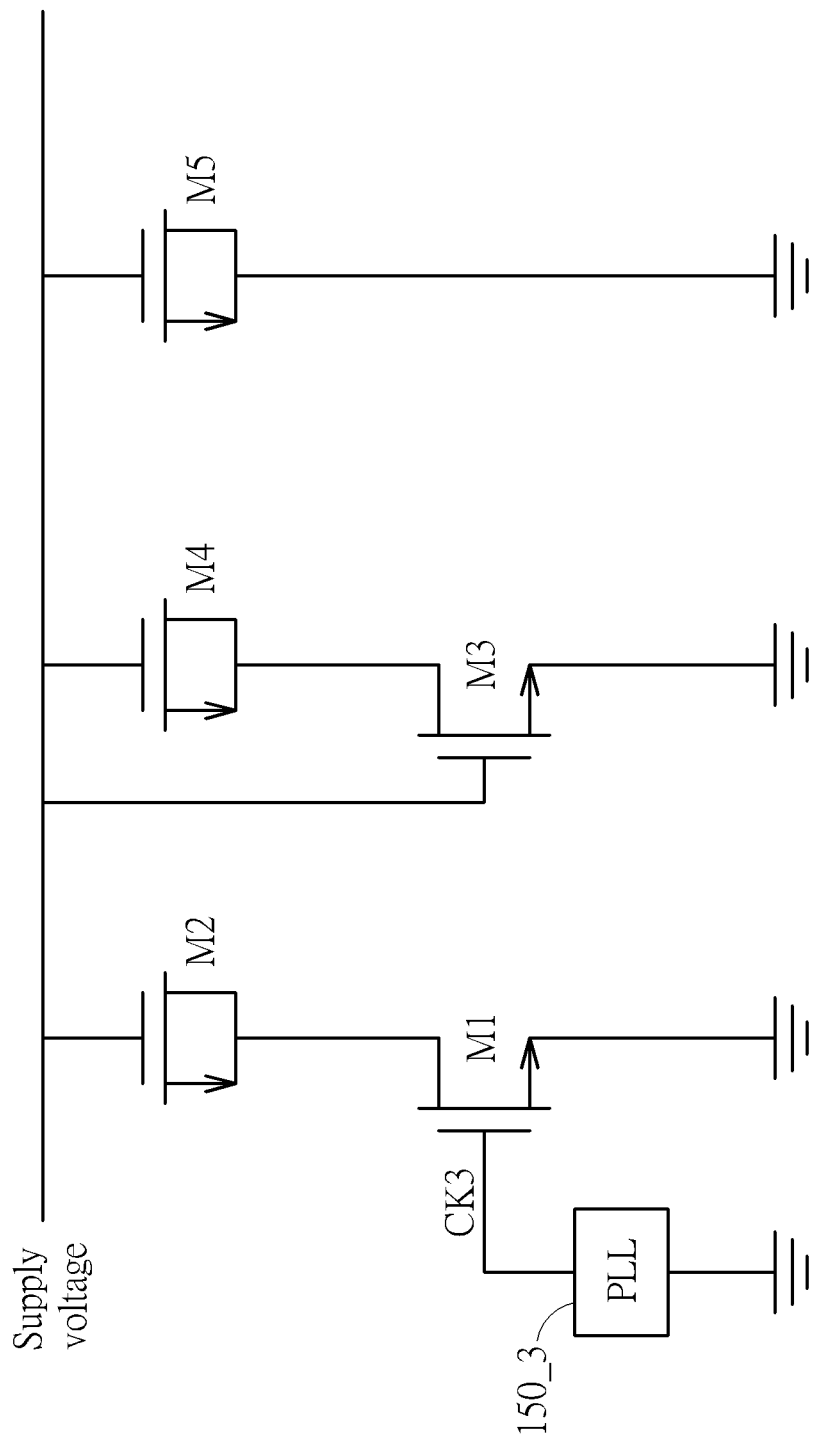
FIG. 4 is a diagram illustrating an adaptive PDN according to one embodiment of the present invention.

In FIG. 1, the drivers 120 can be implemented by a simultaneous Switching Output (SSO) noise generator for generating the current noise according to the supply voltage provided by the adaptive PDN 110, the jitter generator 160 can be implemented by D-type flip-flops supplied by the supply voltage provided by the adaptive PDN 110 to receive the clock CK2 to generate the output clock CKOUT, and the adaptive PDN 110 can be implemented by any type of circuits such as switched capacitors or any other RLC circuit whose impedance is varied with the frequency of the signal applied thereon, without limitations of the present invention. For example, FIG. 4 is a diagram illustrating the adaptive PDN 110 according to one embodiment of the present invention. In FIG. 4, the adaptive PDN 110 comprises five transistors M1-M5, and is modulated by the clock CK3.

Briefly summarized, in the jitter control circuit and jitter control method of the present invention, the adaptive PDN 110 is provided to adjust its own impedance to lower the clock jitter within the chip 102, and the look-up table for adjusting the impedance of the adaptive PDN 110 is built based on the jitters generated based on the internal circuits within the chip 102. Therefore, the information of the look-up table is more reliable, and the impedance of the adaptive PDN 110 can be controlled to effectively lower the clock jitter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A jitter control circuit within a chip, comprising:
an adaptive power delivery network (PDN), capable of being controlled/modulated to provide different impedances;
a current generator, coupled to the adaptive PDN, for receiving a supply voltage provided by the adaptive PDN and generating currents with different patterns; and
a jitter generator, coupled to the adaptive PDN, for generating a plurality of jitters corresponding to the currents with different patterns, respectively, according to the supply voltage provided by the adaptive PDN,
wherein for a portion of the patterns of the currents whose corresponding jitters are greater than a threshold, the adaptive PDN is arranged to be controlled/modulated to have different frequencies to have the different impedances, respectively, and the jitter generator generates the plurality of jitters corresponding to the currents with the portion of the patterns and the different frequencies of the adaptive PDN, respectively, according to the supply voltage provided by the adaptive PDN.

2. The jitter control circuit of claim 1, wherein a look-up table is generated based on the plurality of jitters corresponding to the currents with the portion of the patterns and the different frequencies of the adaptive PDN, respectively, during an off-line period, and the look-up table is stored in the chip.

3. The jitter control circuit of claim 2, further comprising:
a controller, coupled to the current generator, for referring to the look-up table to adjust the impedance of the adaptive PDN according to the pattern of the current generated by the current generator or a pattern of a current generated by other current generator(s), so as to lower a jitter of a clock within the chip.

4. The jitter control circuit of claim 1, further comprising:
a controller, coupled to the current generator, for referring to a look-up table to adjust the impedance of the adaptive PDN according to the pattern of the current generated by the current generator or a pattern of a current generated by other current generator(s), so as to lower a jitter of a clock within the chip;
wherein the look-up table comprises a plurality of combinations of the impedances of the adaptive PDN and the patterns of the current generated by the current generator, and a plurality of jitter levels corresponding to the combinations, respectively.

5. A jitter control method, comprising:
providing an adaptive power delivery network (PDN) capable of being controlled/modulated to provide different impedances;
receiving a supply voltage provided by the adaptive PDN and generating currents with different patterns; and
generating a plurality of jitters corresponding to the currents with different patterns, respectively, according to the supply voltage provided by the adaptive PDN,
wherein for a portion of the patterns of the currents whose corresponding jitters are greater than a threshold, controlling/modulating the adaptive PDN to provide different frequencies to provide the different impedances, respectively; and
the step of generating the plurality of jitters comprises generating the plurality of jitters corresponding to the currents with the portion of the patterns and the different frequencies of the adaptive PDN, respectively, according to the supply voltage provided by the adaptive PDN.

6. The jitter control method of claim 5, further comprising:
generating a look-up table based on the plurality of jitters corresponding to the currents with the portion of the patterns and the different frequencies of the adaptive PDN, respectively, during an off-line period; and
storing the look-up table into the chip.

7. The jitter control method of claim 6, further comprising:
referring to the look-up table to adjust the impedance of the adaptive PDN according to the pattern of the current or a pattern of a current generated by other current generator(s), so as to lower a jitter of a clock within the chip.

8. The jitter control method of claim 5, further comprising:
referring to a look-up table to adjust the impedance of the adaptive PDN according to the pattern of the current or a pattern of a current generated by other current generator(s), so as to lower a jitter of a clock within the chip;
wherein the look-up table comprises a plurality of combinations of the impedances of the adaptive PDN and the patterns of the current, and a plurality of jitter levels corresponding to the combinations, respectively.

9. A jitter control circuit within a chip, comprising:
an adaptive power delivery network (PDN) capable of being controlled/modulated to provide difference impedances;
a current generator, coupled to the adaptive PDN, for receiving a supply voltage provided by the adaptive PDN and generating a current; and
a controller, coupled to the adaptive PDN and the current generator, for controlling the impedance of the adaptive PDN according to a pattern of the current generated by the current generator, wherein the controller refers to a look-up table to adjust the impedance of the adaptive PDN according to the pattern of the current generated by the current generator, wherein the look-up table comprises a plurality of combinations of the impedances of the adaptive PDN and the patterns of the current generated by the current generator, and a plurality of jitter levels corresponding to the combinations, respectively.

10. The jitter control circuit of claim 9, wherein the controller controls the adaptive PDN to provide a different frequency to adjust the impedance of the adaptive PDN according to the pattern of the current generated by the current generator.

11. A circuit, comprising:
a controller configured to:
control a plurality of signal patterns to be generated successively by a signal generator, and
control an adaptive power delivery network (PDN) to have, successively, a plurality of impedances; and
a jitter meter configured to measure different jitter levels of a clock corresponding to different combinations of the plurality of signal patterns and the plurality of impedances, wherein at least a portion of the different combinations is recorded in a look-up table.

12. The circuit of claim 11, wherein the different combinations and the associated different jitter levels are recorded in the look-up table.

13. The circuit of claim 11, wherein the look-up table is stored in the chip.

14. The circuit of claim 11, wherein the look-up table is generated during an off-line period.

15. The circuit of claim 14, wherein during an online period, the controller is further configured to:
refer to the look-up table to adjust the impedance of the adaptive PDN according to the signal pattern generated by the signal generator to lower the jitter level of the clock.

16. A jitter control method, comprising:
generating, successively, a plurality of signal patterns;
controlling an adaptive power delivery network (PDN) to have, successively, a plurality of impedances;
measuring different jitter levels of a clock corresponding to different combinations of the plurality of signal patterns and the plurality of impedances; and
generating a look-up table that records at least a portion of the different combinations and the associated different jitter levels.

17. The jitter control method of claim 16, further comprising:
storing the look-up table in a chip.

18. The jitter control method of claim 16, further comprising:
referring to the look-up table to adjust the impedance of the adaptive PDN according to the signal pattern generated by a signal generator to lower the jitter level of the clock.

* * * * *